US010497832B2

(12) United States Patent
Takeda et al.

(10) Patent No.: US 10,497,832 B2
(45) Date of Patent: Dec. 3, 2019

(54) SEMICONDUCTOR LIGHT-EMITTING ELEMENT HAVING AN ALUMINUM NITRIDE SUBSTRATE

(71) Applicant: ASAHI KASEI KABUSHIKI KAISHA, Tokyo (JP)

(72) Inventors: Koumei Takeda, Tokyo (JP); Satoshi Yamada, Tokyo (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/652,300

(22) Filed: Jul. 18, 2017

(65) Prior Publication Data

US 2017/0317234 A1 Nov. 2, 2017

Related U.S. Application Data

(62) Division of application No. 14/779,664, filed as application No. PCT/JP2014/001841 on Mar. 28, 2014, now abandoned.

(30) Foreign Application Priority Data

Mar. 29, 2013 (JP) ................ 2013-074028
Oct. 31, 2013 (JP) ................ 2013-227375

(51) Int. Cl.
*H01L 33/22* (2010.01)
*H01L 21/02* (2006.01)
(Continued)

(52) U.S. Cl.
CPC ........... *H01L 33/22* (2013.01); *C30B 29/403* (2013.01); *C30B 33/005* (2013.01);
(Continued)

(58) Field of Classification Search
CPC ............ H01L 33/20; H01L 21/02513; H01L 21/0242; H01L 21/02502; H01L 21/02658
(Continued)

(56) References Cited

U.S. PATENT DOCUMENTS 5,909,036 A    6/1999  Tanaka et al.
2003/0178626 A1 9/2003 Sugiyama et al.
(Continued)

FOREIGN PATENT DOCUMENTS

CN    102376839 A    3/2012
EP    2 421 058 A2    2/2012
(Continued)

OTHER PUBLICATIONS

Chen et al., Improved Photon Extraction by Substrate Thinning and Surface Roughening in 260 nm Pseudomorphic Ultraviolet Light Emitting Diodes, IEEE, pp. 1-4, 2012.
(Continued)

*Primary Examiner* — David Chen
(74) *Attorney, Agent, or Firm* — Morgan, Lewis & Bockius LLP (57) ABSTRACT

There are provided a setting process configured to set in a chamber an aluminum nitride substrate in which a semiconductor layer is formed on a first principal plane, and an oxide film forming process configured to heat an inside of the chamber with a water molecule ($H_2O$) being introduced in the chamber and to form an oxide film including an amorphous oxide film and/or a crystalline oxide film on a second principal plane located on an opposite side to the first principal plane of the aluminum nitride substrate.

8 Claims, 9 Drawing Sheets

(51) Int. Cl.
  *H01L 33/20* (2010.01)
  *H01L 33/32* (2010.01)
  *H01L 33/00* (2010.01)
  *H01L 33/44* (2010.01)
  *C30B 29/40* (2006.01)
  *C30B 33/00* (2006.01)

(52) U.S. Cl.
  CPC .... *H01L 21/0242* (2013.01); *H01L 21/02502* (2013.01); *H01L 21/02513* (2013.01); *H01L 33/0075* (2013.01); *H01L 33/20* (2013.01); *H01L 33/32* (2013.01); *H01L 33/44* (2013.01); *H01L 2933/0025* (2013.01)

(58) Field of Classification Search
  USPC ......... 257/76, 98, E21.121, E33.006; 438/29
  See application file for complete search history.

(56) References Cited

U.S. PATENT DOCUMENTS

| | | |
|---|---|---|
| 2005/0145864 A1 | 7/2005 | Sugiyama et al. |
| 2007/0236866 A1* | 10/2007 | Katoh ................... H01G 4/008 361/321.5 |
| 2008/0303042 A1 | 12/2008 | Minato et al. |
| 2010/0255621 A1 | 10/2010 | Minato et al. |
| 2011/0215370 A1 | 9/2011 | Sato et al. |
| 2012/0043568 A1 | 2/2012 | Yon et al. |
| 2012/0225268 A1* | 9/2012 | Antonov ................ H01G 4/306 428/213 |
| 2013/0127000 A1 | 5/2013 | Oganesian |
| 2013/0146892 A1 | 6/2013 | Minato et al. |
| 2013/0234166 A1 | 9/2013 | Ko et al. |
| 2014/0124805 A1 | 5/2014 | Minato et al. |
| 2014/0125219 A1* | 5/2014 | Choi ..................... H05B 33/04 313/503 |

FOREIGN PATENT DOCUMENTS

| | | |
|---|---|---|
| JP | H03-093612 A | 4/1991 |
| JP | H10-074980 A | 3/1998 |
| JP | 2003-218383 A | 7/2003 |
| JP | 2010-132525 A | 6/2010 |
| JP | 2011-187658 A | 9/2011 |
| JP | 2012-238895 A | 12/2012 |

OTHER PUBLICATIONS

Extended European Search Report dated Oct. 12, 2016, for the corresponding European Patent Application No. 14775606.8.
International Preliminary Report on Patentability dated Oct. 8, 2015, for the corresponding International application No. PCT/JP2014/001841.
International Search Report dated Jun. 17, 2014, for International application No. PCT/JP2014/001841.

* cited by examiner

SEMICONDUCTOR LIGHT-EMITTING ELEMENT HAVING AN ALUMINUM NITRIDE SUBSTRATE

TECHNICAL FIELD

This application is a divisional of U.S. application Ser. No. 14/779,664, filed Sep. 24, 2015, which claims priority of Japanese PCT Application No. PCT/JP2014/001841, filed on Mar. 28, 2014, which claims priority of Japanese Patent Application No. 2013-227375, filed on Oct. 31, 2013 and Japanese Patent Application No. 2013-074028, filed on Mar. 29, 2013, the disclosure of which is hereby incorporated by reference herein in its entirety.

The present invention relates to a manufacturing method of a semiconductor light-emitting element, and the semiconductor light-emitting element, and in particular, relates to a manufacturing method of a semiconductor light-emitting element in which a semiconductor layer is formed on an aluminum nitride substrate, and the semiconductor light-emitting element.

BACKGROUND ART

A semiconductor light-emitting element, for example, a light-emitting diode (LED) of a nitride semiconductor generally includes a semiconductor stacked part in which an n-type semiconductor layer, a light-emitting layer, an electron blocking layer, and a p-type semiconductor layer are sequentially stacked on a substrate, and an electrode for applying a voltage to the light-emitting layer.

Then, the light generated at the light-emitting layer is emitted to the outside of the semiconductor light-emitting element from an externally exposed face (top face, side face) or an exposed face (back face, side face) of the substrate. On this occasion, at a semiconductor interface or at an interface between the semiconductor light-emitting element and the air, the incident light at an angle equal to or larger than a critical angle propagates in the semiconductor layer while repeating the total reflection from the limitation of the total reflection to be decided by a refractive index of the interface. In the meantime, the light is partially absorbed in the semiconductor layer itself or is absorbed into the electrode and converted into heat, resulting in that the light extraction efficiency to the outside degrades and the light-emitting strength decreases. Therefore, various concepts have been made to improve the light extraction efficiency.

Especially, a technology of improving the light extraction efficiency by processing the semiconductor element surface so that the light enters the interface at a critical angle or smaller is often used. Patent Literature 1 discloses a technique of forming an uneven structure in which a height is equal to or more than 100 nm on the surface of a semiconductor layer and/or on the surface of a sapphire substrate and the base has cone-shaped projections with different sizes of 1 nm to 500 nm, by using an organic substance that undergoes phase separation as a mask for dry etching the surface of the semiconductor layer that forms an interface with its outside and/or the surface of the sapphire substrate. In addition, Patent Literature 2 discloses a method of improving the light extraction efficiency of the light-emitting element, by forming substantially polygon-shaped unevenness on the surface of the side where the semiconductor layer of the sapphire substrate is formed by using the mask and etching.

CITATION LIST

Patent Literature

PLT 1: JP 2003-218383 A
PLT 2: JP 2012-238895 A

SUMMARY

Technical Problem

The technologies disclosed in Patent Literatures 1 and 2, however, still have room for improvement in the following points.

Like the above-described technologies, in the method of forming the mask on the processed surface by use of the photolithography process or the phase separation of the organic substance and carrying out the etching process with the mask, a desired uneven pattern can be formed on the substrate surface. However, in the method of forming the uneven pattern by using the mask, several stages are necessary for the mask forming process. Hence, the mass productivity is bad and the manufacturing costs increase.

Besides, in the technology of forming the uneven structure in the dry etching like Patent Literature 1, not only the processed surface but also the internal semiconductor layer are subject to etching damages. Hence, the light output of the semiconductor light-emitting element might be degraded. Moreover, in the technology of providing the optical pattern of uneven structure having the light extraction effect on the surface (an interface between the substrate and the semiconductor layer) of the side on which the semiconductor layer of the substrate is made to grow as disclosed in Patent Literature 2, the semiconductor layer has to be formed on the substrate surface having such an uneven structure. Hence, the semiconductor layer crystal properties might deteriorate and the light output might be lowered.

Therefore, the present invention has been made in view of the above circumstances, and has an object to provide a manufacturing method of a semiconductor light-emitting element, in which the light extraction efficiency of the semiconductor light-emitting element can be improved, and the mass productivity is good, while an etching damage onto the semiconductor layer or a deterioration in crystal property of the semiconductor layer in the semiconductor light-emitting element is being suppressed, and the semiconductor light-emitting element.

Solution to Problem

As a result of earnestly studying how to address the above-described drawbacks, the inventors of the present invention have found out that the above-described drawbacks can be addressed by a manufacturing method of a semiconductor light-emitting element, and the semiconductor light-emitting element to be described below.

That is to say, in one embodiment of the present invention, there is provided a manufacturing method of a semiconductor light-emitting element, the manufacturing method including: setting in a chamber an aluminum nitride substrate in which a semiconductor layer is formed on a first principal plane; and heating an inside of the chamber with a water molecule being introduced in the chamber to form an oxide film including an amorphous oxide film and/or a crystalline oxide film on a second principal plane located on an opposite side to the first principal plane of the aluminum nitride substrate.

DESCRIPTION OF EMBODIMENTS

Hereinafter, embodiments (hereinafter, also referred to as present embodiment) to carry out the present invention will be described in detail.

(Manufacturing Method of Semiconductor Light-emitting Element)

The manufacturing method of the semiconductor light-emitting element in the present embodiment includes a setting process of setting up in a chamber an aluminum nitride (AlN) substrate in which a semiconductor layer is formed on a first principal plane, and an oxide film forming process of heating the inside of the chamber with water ($H_2O$) molecules being introduced in the chamber, and forming an oxide film including an amorphous oxide film and/or a crystalline oxide film, on a second principal plane of the aluminum nitride substrate.

(Setting Process)

The setting process in the manufacturing method of the semiconductor light-emitting element in the present embodiment is a process of setting up in a chamber the aluminum nitride substrate in which the semiconductor layer is formed on the first principal plane.

The chamber is not particularly limited, as far as the aluminum nitride substrate can be set up in its inside and water molecules can be introduced into its inner space. In the oxide film forming process, when the relative humidity, the temperature, and the relative pressure are controlled to fall within desired ranges, respectively, the chamber has a mechanism of controlling the relative humidity, the temperature, and the relative pressure, while monitoring them, in one embodiment of the present invention.

(Oxide Film Forming Process)

In the oxide film forming process in the manufacturing method of the semiconductor light-emitting element in the present embodiment, the inside of the chamber is heated with the water molecules being introduced in the chamber, so as to form an oxide film including an amorphous oxide film and/or a crystalline oxide film on the second principal plane of the aluminum nitride substrate.

In addition, the oxide film is formed by controlling process conditions (such as the relative humidity, the temperature, the relative pressure, and a process time), in one embodiment. The oxide film may be a monolayer of the amorphous oxide film or the crystalline oxide film, or may be a stack of the amorphous oxide film and the crystalline oxide film.

Note that it is known that a natural oxide film is formed on the surface of the aluminum nitride substrate by exposing the aluminum nitride substrate in the atmosphere. However, it has been confirmed from Examples to be described later that no improvement in the light extraction efficiency is made in the natural oxide film, but effects of the improvement in the light extraction efficiency from the second principal plane are brought out by the oxide film including the amorphous oxide film and/or the crystalline oxide film on the second principal plane of the aluminum nitride substrate, the oxide film being obtained by intentionally heating the inside of the chamber with the water molecules being introduced in the chamber.

From a viewpoint of forming an oxide film that further improves the light extraction efficiency, the relative humidity in the chamber in the oxide film forming process may be equal to or higher than 50% and equal to or lower than 100%, in one embodiment, or may be equal to or higher than 65% and equal to or lower than 100%, in another embodiment.

In addition, from a viewpoint of forming the oxide film that further improves the light extraction efficiency, the temperature in the chamber in the oxide film forming process may be equal to or higher than 100° C. and equal to or lower than 140° C., in one embodiment, or may be equal to or higher than 105° C. and equal to or lower than 121° C., in another embodiment.

Further, from a viewpoint of forming the oxide film that further improves the light extraction efficiency, the relative pressure force (gauge pressure) in the chamber in the oxide film forming process may be equal to or higher than 0.01 MPa and equal to or lower than 0.3 MPa, in one embodiment, or may be equal to or higher than 0.01 MPa and equal to or lower than 0.1 MPa, in another embodiment.

Hereinafter, a mechanism of forming the oxide film in the oxide film forming process will be described. In the oxide film forming process in the present embodiment, the inside of the chamber is heated with the water molecules being existent in the chamber to form the oxide film including the amorphous oxide film and/or the crystalline oxide film on the second principal plane of the aluminum nitride substrate. Therefore, as compared to the condition where a natural oxide film is formed, it is supposed that steam easily reacts with the second principal plane of the aluminum nitride substrate and the oxide film including the amorphous oxide film and/or the crystalline oxide film with effects of the light extraction improvement is formed. The amorphous oxide film with effects of the light extraction improvement remarkably is formed, in one embodiment, when the second principal plane of the aluminum nitride substrate is processed at the temperature equal to or higher than 100° C., the relative humidity equal to or higher than 50%, the pressure force higher than the atmospheric pressure.

In addition, when the temperature in the chamber is high (for example, higher than 105° C.), it has been confirmed in Examples to be described later that the crystalline oxide film having a surface of an uneven structure tends to be formed. It is supposed that the crystalline oxide film is formed by hydrothermal synthesis.

As the oxide film including aluminum (Al), aluminum oxide, hydration aluminum oxide, aluminum hydroxide, or a membrane in which the above aluminum and aluminum nitride are mixed can be given, but the oxide film including aluminum is not limited to them. In the oxide film forming process, by controlling at least one of the temperature, the relative humidity, the relative pressure, and any combination thereof, the reaction of the second principal plane of the aluminum nitride substrate and the steam is controlled, so that the oxide film or the uneven form of the surface can be controlled.

In the oxide film forming process in the present embodiment, plasma or the like used by dry etching is not used. Accordingly, since no etching damage is made onto the semiconductor layer, a reduction in the light-emitting efficiency caused by the etching damage is suppressed.

In addition, in the oxide film forming process in the present embodiment, after the semiconductor layer is formed, the oxide film having an uneven structure on the second principal plane of the aluminum nitride substrate is formed. Such an uneven structure is formed on the second principal plane, instead that an optical pattern with the light extraction effect is formed on a surface of a side where the semiconductor layer of the substrate (an interface between the substrate and the semiconductor layer) is made to grow. Thus, since no effect is given to the crystal defect occurrence at the time of the semiconductor layer growth, there is no reduction in the light-emitting efficiency caused by the crystal defect.

(Aluminum Nitride Substrate)

As to the aluminum nitride substrate used in the manufacturing method of the semiconductor light-emitting element in the present embodiment, any aluminum nitride substrate may be used as far as it includes a constituent element mainly including aluminum (Al) and nitrogen (N).

In addition, any aluminum nitride substrate is used as far as it has the first principal plane on which a semiconductor layer is formed and the second principal plane on which an oxide film is formed in the oxide film forming process. The shape of the aluminum nitride substrate is not limited in particular, may be a form of wafer, or may be a form of individual tip. The first principal plane and the second principal plane face each other in substantially parallel to each other, in one embodiment.

In addition, the above aluminum nitride substrate may include various kinds of dopants or impurities, if necessary. The above aluminum nitride substrate may be a polycrystal or single crystal. The single crystal is used from a viewpoint of forming the semiconductor layer with good crystal properties, in one embodiment.

Further, the method of manufacturing the aluminum nitride substrate is not limited in particular. For example, aluminum nitride obtained by a sublimation method, HVPE (Hydride Vapor Phase Epitaxy), MOCVD (Metal Organic Chemical Vapor Deposition), MBE (Molecular Beam Epitaxy), or the like can be used.

From a viewpoint of flatness and crystal property improvement of the semiconductor layer, the first principal plane of the aluminum nitride substrate may be an Al plane, in one embodiment, or may be a C plane and Al plane in a hexagonal crystal, in another embodiment. Furthermore, from a viewpoint of efficiently forming the oxide film in the present embodiment, the second principal plane of the aluminum nitride substrate may be a C plane and N plane in the hexagonal crystal, in yet another embodiment.

Moreover, in the manufacturing method of the semiconductor light-emitting element in the present embodiment, from a viewpoint of further improving the effects in the light extraction efficiency improvement, the second principal plane of the aluminum nitride substrate is a plane that has not been subject to CMP (Chemical Mechanical Polishing), in further another embodiment.

(Semiconductor Layer)

The semiconductor layer formed on the first principal plane of an aluminum nitride substrate used in the manufacturing method of the semiconductor light-emitting device in the present embodiment is not limited in particular, as far as it emits light when electricity is supplied to the semiconductor layer.

The semiconductor layer may be a single layer, or may have a layered structure in which plural semiconductor layers having different constituent elements or different ratios of the constitution elements are stacked. From a viewpoint of improving the light-emitting efficiency, the semiconductor layer may have a layered structure in one embodiment. Such a layered structure may have an n-type semiconductor layer, a light-emitting layer, an electron blocking layer, and a p-type semiconductor layer, in another embodiment. Such a layered structure further includes a contact layer that lowers a contact resistance with an electrode in a region in contact with the electrode for supplying the electricity, in yet another embodiment.

From a viewpoint of improving the light-emitting efficiency, the light-emitting layer has a multiplex quantum well structure (MQW, Multi-Quantum Well), in one embodiment.

From a viewpoint of controlling an emission wavelength, the semiconductor layer may be a compound semiconductor, in one embodiment, may be a group III-V compound semiconductor, in another embodiment, may be a group III-V compound semiconductor layer including an element selected from a group consisting of aluminum, gallium, nitrogen and indium, in yet another embodiment, or may be a nitride compound semiconductor, in further another embodiment. A constitution element or a composition ratio of the semiconductor layer can be selected in various ways depending on what light of wavelength should be emitted. When the nitride compound semiconductor is used, for example, gallium nitride, aluminum nitride, indium nitride, boron nitride, or a mixed crystal thereof can be used, but the nitride compound semiconductor is not limited to them.

In addition, from a viewpoint of extracting the light effectively from the second principal plane of the aluminum nitride substrate, a mesa structure, an n-electrode, and a p-electrode electrode may be formed on the first principal plane of the aluminum nitride substrate, in one embodiment, instead of forming the electrode on the second principal plane of the aluminum nitride substrate.

(Oxide Film)

The oxide film formed by the manufacturing method of the semiconductor light-emitting element in the present embodiment is not limited in particular, as far as it is an oxide film including an amorphous oxide film and/or a crystalline oxide film (that is, only the amorphous oxide film, only the crystalline oxide film, or both of the amorphous oxide film and the crystalline oxide film may be included).

From a viewpoint of improving the light-emitting efficiency, the amorphous oxide film may be an oxide film including Al, in one embodiment. In addition, from a viewpoint of improving the light-emitting efficiency, it may be an oxide film having an uneven structure, in another embodiment. That is, the interface between the oxide film and the aluminum nitride substrate may have an uneven structure, or the surface of the oxide film (that is, a plane on an opposite side to the plane in contact with the aluminum nitride substrate of the oxide film) may have an uneven structure, in yet another embodiment. In addition, the oxide film may have a layered structure having plural oxide films including the amorphous oxide film and the crystalline oxide film, and the oxide film may have an uneven structure at the interface between the amorphous oxide film and the crystalline oxide film. The crystalline oxide film is a polycrystal including Al, in one embodiment. Further, the oxide film may have a layered structure having plural oxide films including the amorphous oxide film and the crystalline oxide film, and the oxide film may have a structure having the crystalline oxide film on the amorphous oxide film.

As to such an uneven structure at the interface between the oxide film and the aluminum nitride substrate, when the height of the uneven structure to be described later is smaller than 10 nm, the structure is assessed to be flat (there is no uneven structure). When the height is equal to or larger than 10 nm, the structure is assessed to be uneven. From a viewpoint of improving the extraction efficiency, the height of the uneven structure may be equal to or larger than 10 nm and equal to or smaller than 2 in one embodiment, may be equal to or larger than 50 nm and equal to or smaller than 1 in another embodiment, or may be equal to or larger than 100 nm and equal to or smaller than 500 nm, in yet another embodiment.

The height of the uneven structure is measured by using an image obtained by capturing a cross section of the oxide film with a STEM (Scanning Transmission Electron Microscope) (image magnification: 40000 times). Firstly, a reference line parallel to an interface between the aluminum nitride substrate and the semiconductor layer is arranged below the uneven structure not to overlap the uneven structure. Next, a distance from the reference line to the uneven structure (the interface between the surface of the oxide film and/or the oxide film and the aluminum nitride substrate) is read for 3 µm in width with respect to the reference line. A ten-point average roughness R is calculated, which is a difference between an average of the distances (Yp) from the top having the longest distance to the top having the fifth longest distance and an average of the distances (Yv) from the bottom having the shortest distance to the bottom having the fifth shortest distance. The top and the bottom mean regions where the inclination is parallel to the reference line. It is to be noted that when there is no top or bottom in a range of 3 µm in width with respect to the reference line, the height of the uneven structure is supposed to zero. In addition, when the total number of the tops and the bottoms in the range of 3 µm in width with respect to the reference line is equal to or larger than 1 and equal to or smaller than 20, after moving to an adjacent field of vision from the image-captured area, the cross-sectional images are captured until the total number is at least 20.

The above-described ten-point average roughness R is calculated for different five points of cross sections, so that the average value of the ten-point average roughness R at five points of cross sections is supposed to be the height of the uneven structure.

The oxide film may include aluminum as a constitution element. As the oxide film including aluminum, as described above, aluminum oxide, hydration aluminum oxide, aluminum hydroxide, or a film in which the above aluminum is mixed with aluminum nitride may be used, but the oxide film is not limited to them.

The refractive index of such an oxide film is lower than the refractive index of aluminum nitride which is a material of the substrate. In particular, the refractive indexes of the above-described aluminum oxide, hydration aluminum oxide, and aluminum hydroxide are lower than the refractive index of aluminum nitride.

The thickness of the oxide film is not limited in particular. However, as no effect in the light extraction efficiency improvement can be expected at the thickness of the natural oxide film or so, the thickness of the oxide film may be equal to or larger than 10 nm or equal to or smaller than 5 µm, in one embodiment, or may be equal to or larger than 100 nm or equal to or smaller than 5 µm, in another embodiment. When the oxide film has a layered structure of the amorphous oxide film and the crystalline oxide film, from a viewpoint of improving the light extraction efficiency, the thickness of the amorphous oxide film may be equal to or larger than 10 nm or equal to or smaller than 3 in one embodiment, may be equal to or larger than 50 nm or equal to or smaller than 2.5 in another embodiment, or may be equal to or larger than 100 nm or equal to or smaller than 2 in yet another embodiment. The thickness of the crystalline oxide film may be equal to or larger than 10 nm or equal to or smaller than 2 in one embodiment, may be equal to or larger than 50 nm or equal to or smaller than 1.5 in another embodiment, or may be equal to or larger than 100 nm or equal to or smaller than 1 in yet another embodiment.

Figure 12A:
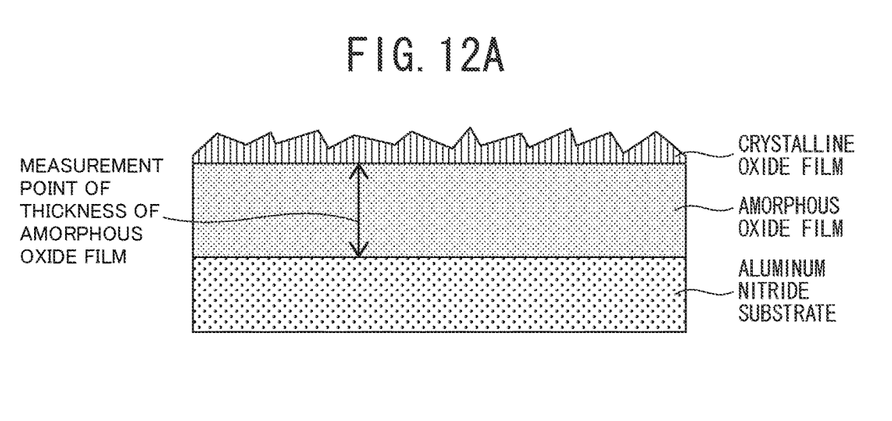
FIG. 12A and FIG. 12B are schematic cross-sectional views illustrative of a measuring method of a thickness of an oxide film.
Figure 12B:
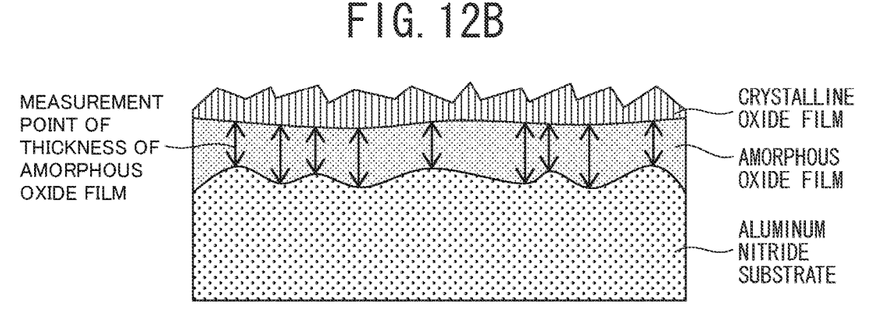

The thickness of the oxide film is measured by capturing a cross-sectional image of the oxide film with STEM. The measurement direction (axis) of the thickness is set to a direction perpendicular to the interface between the aluminum nitride substrate and the semiconductor layer. For example, as illustrated in FIG. 12A, when the interface between the oxide film and the aluminum nitride substrate is flat, a value measured at one point is supposed to be the thickness of the oxide film. In addition, when the oxide film or the aluminum nitride substrate has an uneven structure, since a dent and a projection appear repeatedly, the depth is different depending on the measurement point. For example, as illustrated in FIG. 12B, when the interface between the oxide film and the aluminum nitride substrate (substrate) has an uneven structure, such an uneven structure of the substrate is supposed to be a reference and an average value of values measured with all dents and projections of the uneven structure of the substrate is supposed to the thickness of the oxide film. The image magnification is 300000 times, when the thickness of the oxide film is 10 nm to 100 nm, the image magnification is 20000 times, when the thickness of the oxide film is 100 nm to 3 The image magnification is 5000 times, when the thickness of the oxide film is 3 µm to 5 µm.

The whole aspect of the mechanism of improving the light extraction efficiency of the semiconductor light-emitting element is not still clear with the oxide film formed in the manufacturing method of the semiconductor light-emitting element in the present embodiment. However, the structure has the oxide film having the refractive index smaller than that of the aluminum nitride substrate on the second principal plane of the aluminum nitride substrate. Therefore, it is supposed that the critical angle defined in Snell's law can be designed to be large at the interface between the aluminum nitride substrate and the oxide film, the reflection of the incident light is restrained due to the large critical angle, and the extraction efficiency increases. Further, it is supposed that since the oxide film formed in the present embodiment has a density or composition continuously or discontinuously changing, a reflection of the light at the interface between the substrate and the oxide film is restrained, and the light extraction efficiency is improved.

In particular, when the oxide film has the layered structure of the amorphous oxide film and the crystalline oxide film, it is supposed that the light extraction efficiency by the above-mentioned mechanism can be remarkably improved. Furthermore, when at least one of the surface of the oxide film, the interface of the oxide film (for example, the interface between the amorphous oxide film and the crystalline oxide film), and the interface between the oxide film and the aluminum nitride substrate has an uneven structure, the light extraction efficiency improvement caused by the light scattering effect can occur, too. Also, by forming the uneven structure on the oxide film in consideration of the light scattering effect, the semiconductor light-emitting element that further improves the light extraction efficiency is made available.

(Example of Process Flow)

Next, referring to the drawings, a process flow in the present embodiment will be described with an example. Here, a manufacturing process will be sequentially described from an aluminum nitride substrate to a completion of a semiconductor light-emitting element in the present embodiment. In addition, an oxide film forming device suitable for use in the present embodiment will be described.

Figure 1:
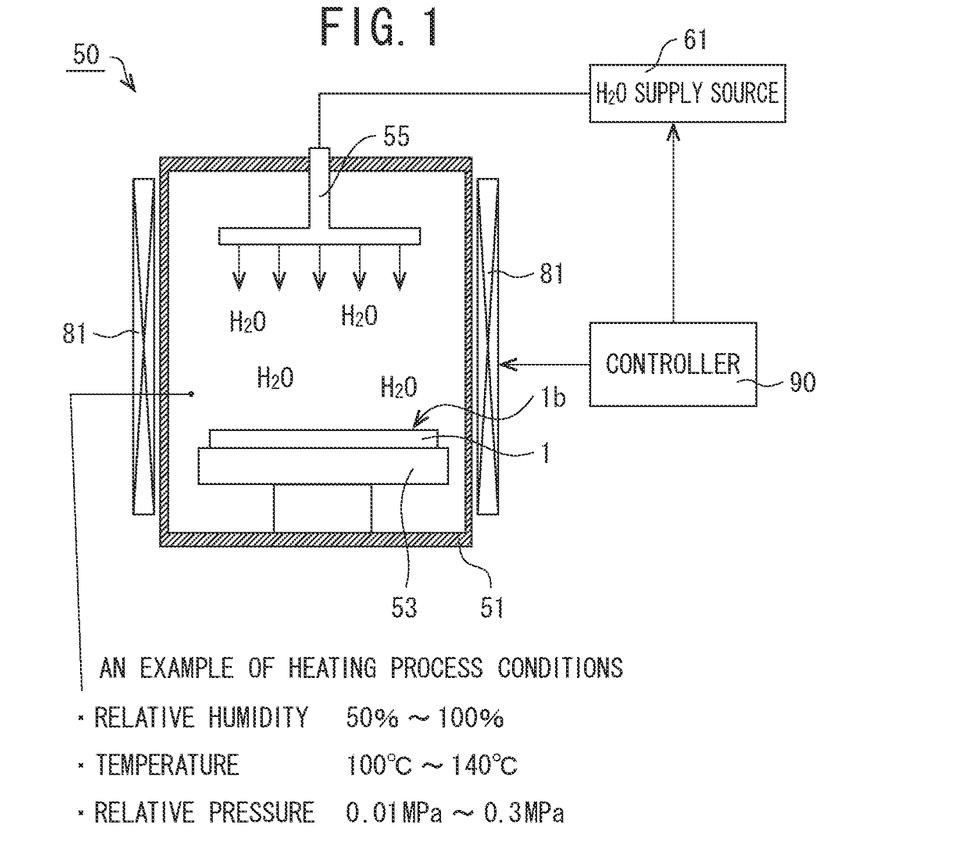
FIG. 1 is a schematic view illustrative of a configuration example of an oxide film forming device 50 suitable for use in one embodiment of the present invention.

FIG. 1 is a schematic view illustrative of a configuration example of an oxide film forming device 50 suitable for use in the present embodiment. FIG. 2A to FIG. 2D are cross-sectional views illustrative of sequential processes in a manufacturing method of a semiconductor light-emitting element 100 in the present embodiment.

In this process flow, firstly, the oxide film forming device 50 is prepared beforehand so that an oxide film 20 is formed on a second principal plane 1b of an aluminum nitride substrate 1 (that is to say, to carry out the setting process and the oxide film forming process).

As illustrated in FIG. 1, the oxide film forming device 50 includes a chamber 51 that can be sealed to maintain its inside at an atmospheric pressure or higher, a stage 53 arranged at the inside of the chamber 51 to be capable of supporting the aluminum nitride substrate (for example, wafer) 1, a nozzle 55 arranged at an upper center in the chamber 51, an $H_2O$ supply source 61 configured to supply water ($H_2O$) molecules into the chamber 51 through the nozzle 55, a heater 81 arranged at a circumference of the chamber 51 and configured to heat the inside of the chamber 51, and a controller 90 configured to control the $H_2O$ supply source 61 and the heater 81, respectively, so that the relative humidity and the temperature in the chamber 51 fall within ranges set beforehand (that is, predefined ranges). Also, although not illustrated, a heater may be built in the stage 53, so that such a heater built in the stage 53 may heat the inside of the chamber.

Here, the value of the relative pressure (gauge pressure) in the chamber 51 is determined by the relative humidity and the temperature in the chamber 51. The relative pressure in the chamber 51 is not an independent parameter. The relative pressure in the chamber 51 is controlled by the controller 90 (or is set beforehand by a device manager who manages the oxide film forming device 50). By setting the temperature and the relative humidity in the chamber 51 to be higher than a stand-by state, the relative pressure can be relatively higher than the atmospheric pressure. Further, although not illustrated, the oxide film forming device 50 may be provided with a pressure pump capable of intentionally controlling the relative pressure in the chamber 51.

Further, the $H_2O$ supply source 61 may include a water tank, which is not illustrated in the oxide film forming device 50, and a heater for the water tank (a different heater from the heater for heating the chamber), so that the water in the water tank may be heated with the heater for the water tank to supply the water which has changed into gas into the chamber 51 through the nozzle 55. In this case, the relative humidity in the chamber 51 depends on the output from the heater for the water tank and an ambient temperature in the chamber. The output from the heater for the water tank may be controlled by the controller 90, or may take a value set beforehand by the device manager.

Figure 2A:
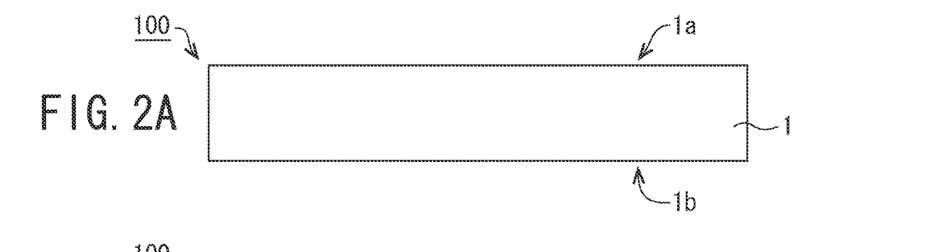
FIG. 2A to FIG. 2D are cross-sectional views illustrative of sequential processes in a manufacturing method of a semiconductor light-emitting element 100 in one embodiment of the present invention.
Figure 2B:
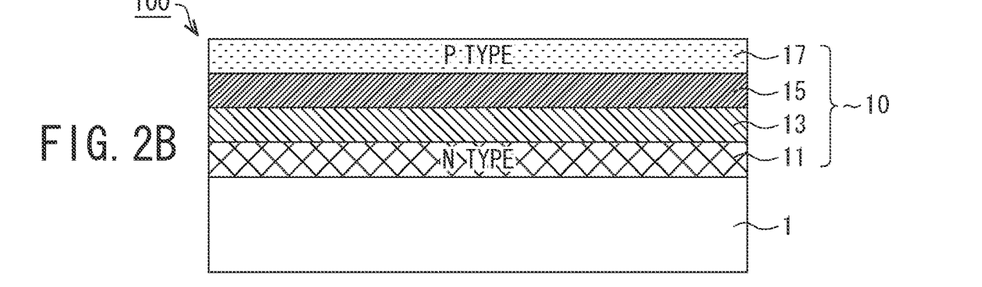

The aluminum nitride substrate 1 is prepared next. As illustrated in FIG. 2A, the aluminum nitride substrate 1 has a first principal plane 1a, and a second principal plane 1b located on the opposite side to the first principal plane 1a. As illustrated in FIG. 2B, an n-type semiconductor layer 11, a light-emitting layer 13, an electron blocking layer 15, and a p-type semiconductor layer 17 are sequentially stacked on the first principal plane 1a of the aluminum nitride substrate 1 to form the semiconductor layer 10 including these layers. The semiconductor layer 10 is formed in MBE method or MOCVD method, for example.

Figure 2C:
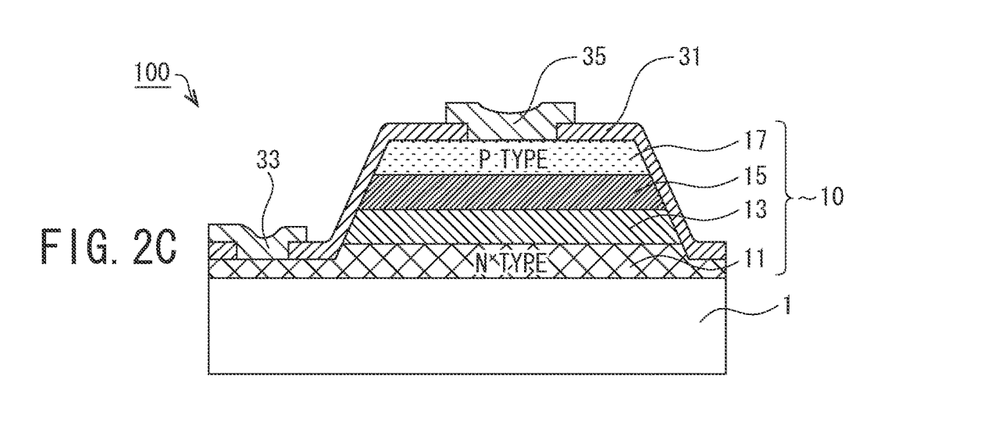

Next, as illustrated in FIG. 2C, the semiconductor layer 10 is patterned in a mesa shape by using a photolithography technique and an etching technique. Then, an insulating film 31 is deposited on the first principal plane 1a of the aluminum nitride substrate 1 to cover the semiconductor layer 10 that has been patterned in the mesa shape (that is to say, in a mesa structure). The insulating film 31 is a silicon oxide ($SiO_2$) film, for example, and is formed in CVD method, for example.

Then, by using well-known photolithography technique and etching technique, the insulating film 31 is partially removed to form contact holes having bottoms of the n-type semiconductor layer 11 and the p-type semiconductor layer 17, respectively.

Subsequently, by using a photolithography technique and a lift off technique, metal membranes are selectively deposited to embed the contact holes. The metal membranes are deposited in a vacuum deposition method, for example. Thus, an electrode portion 33 electrically connected to the n-type semiconductor layer 11 and an electrode portion 35 electrically connected to the p-type semiconductor layer 17 are formed.

Next, the aluminum nitride substrate 1 in which the electrode portion 35 is formed is set on the stage 53 of the oxide film forming device 50 illustrated in FIG. 1. Here, as illustrated in FIG. 1, the aluminum nitride substrate 1 is set on the stage 53 with the second principal plane 1b of the aluminum nitride substrate 1 facing upward (that is to say, facing the nozzle 55 side) (the setting process).

Figure 2D:
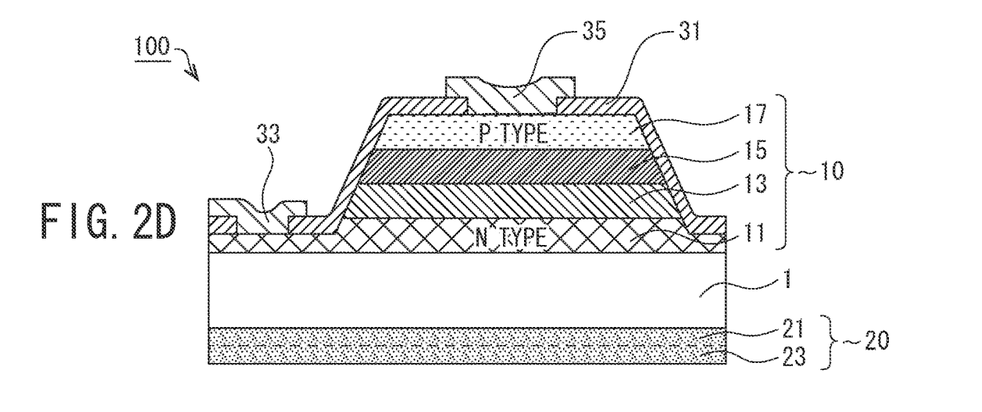

Then, the chamber 51 is heated with the water molecules being introduced in the chamber 51. Accordingly, as illustrated in FIG. 2D, the second principal plane 1b of the aluminum nitride substrate 1 is subject to a heating process to form the oxide film 20 including an amorphous oxide film 21 on the second principal plane 1b (the oxide film forming process).

Here, the controller 90 illustrated in FIG. 1 is configured to control the $H_2O$ supply source 61 and the heater 81, so that the heating process conditions (the relative humidity, the temperature, the relative pressure, the process time) of the aluminum nitride substrate 1 fall within predefined ranges. Also, the controller 90 may be configured to control the heating process conditions to further form a crystalline oxide film 23 having a surface of an uneven structure on the amorphous oxide film 21 of the second principal plane 1b. The crystalline oxide film 23 is formed at the same time with the amorphous oxide film 21 in the oxide film forming process.

Then, after the oxide film 20 is formed on the second principal plane 1b of the aluminum nitride substrate 1, the aluminum nitride substrate 1 is taken out from the chamber 51 of the oxide film forming device 50. Through the above-mentioned processes, the semiconductor light-emitting element 100 in the present embodiment is manufactured.

(Effects of Embodiments)

According to embodiments of the present invention, the inside of the chamber 51 is heated with the water molecules being introduced in the chamber 51 in which the aluminum nitride substrate 1 is arranged. Thus, it is possible to form the oxide film 20 including the amorphous oxide film 21 and/or the crystalline oxide film 23, which are smaller in refraction index than the aluminum nitride substrate 1, on the second principal plane 1b of the aluminum nitride substrate 1. As a result, it is made possible to remarkably improve the light extraction efficiency from the second principal plane 1b of the aluminum nitride substrate 1.

In addition, in the process of forming the oxide film 20 as described above (that is to say, the oxide film forming process), the etching process does not have to be carried out on the surface of the oxide film 20 or the second principal plane 1b of the aluminum nitride substrate 1. Accordingly, the mass productivity is good and an etching damage to the aluminum nitride substrate 1 or the semiconductor layer 10 can be suppressed.

Furthermore, the above-described oxide film forming process is carried out after the semiconductor layer 10 is formed. In this manner, the oxide film is formed on the second principal plane, instead that an optical pattern of an uneven structure with the light extraction effect is arranged on the surface on which the semiconductor layer of the substrate is made to grow (the interface between the substrate and the semiconductor layer). Thus, since the oxide film forming process does not affect a crystal defect occurrence at the time of the semiconductor layer growth, a degradation in the crystal property of the semiconductor layer 10 can be suppressed.

EXAMPLES

The present invention will be described in more detail based on Examples. It is to be noted that the present invention is not limited to the following Examples, and can be changed as necessary.

Example 1

By use of a MOCVD (Metal Organic Chemical Vapor Deposition) device, a wafer in which an n-type semiconductor layer including aluminum, gallium, and nitrogen, an MQW (Multiple Quantum Well) light-emitting layer, an electron blocking layer, and a p-type semiconductor layer are sequentially formed on an aluminum nitride substrate, and was subject to well-known lithography technique and dry etching technique to make a mesa structure from which the n-type semiconductor layer is exposed, so that electrodes were vapor-deposited on both p-type semiconductor layer and the n-type semiconductor layer, and the second principal plane of the aluminum nitride substrate was ground. In this manner, six semiconductor light-emitting elements of the ultraviolet region were manufactured.

Then, an electrical current of 100 mA was applied to each of the semiconductor light-emitting elements, and the light-emitting intensity of each semiconductor light-emitting element was measured and recorded as an initial value.

Next, each semiconductor light-emitting element was set in a chamber and held for 1000 hours under conditions that the temperature was 121° C., the relative humidity was 100%, and the relative pressure was 0.1 MPa (the setting process, the oxide film forming process).

In the meanwhile, after 50 hours, 100 hours, 250 hours, 350 hours, 450 hours, 550 hours, 750 hours, and 1000 hours elapsed from the start of the process, each semiconductor light-emitting element was taken out once. The electrical current of 100 mA was applied, and the light-emitting intensity of each semiconductor light-emitting element was measured and recorded.

Figure 3:
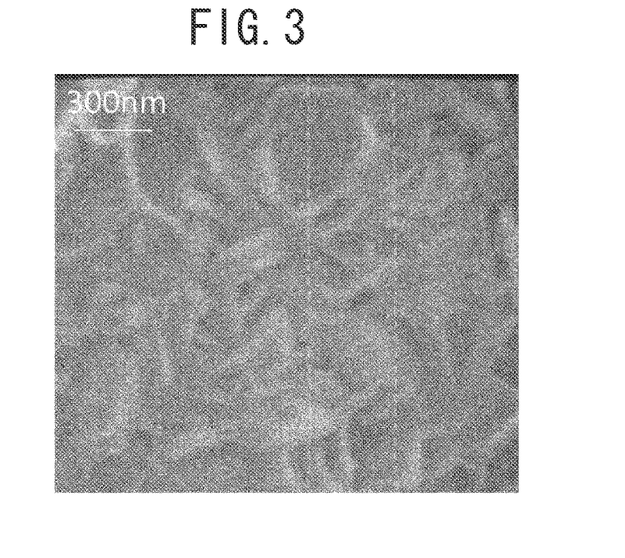
FIG. 3 is a SEM image in which a surface of a second principal plane processed in Example 1 is observed.
Figure 4:
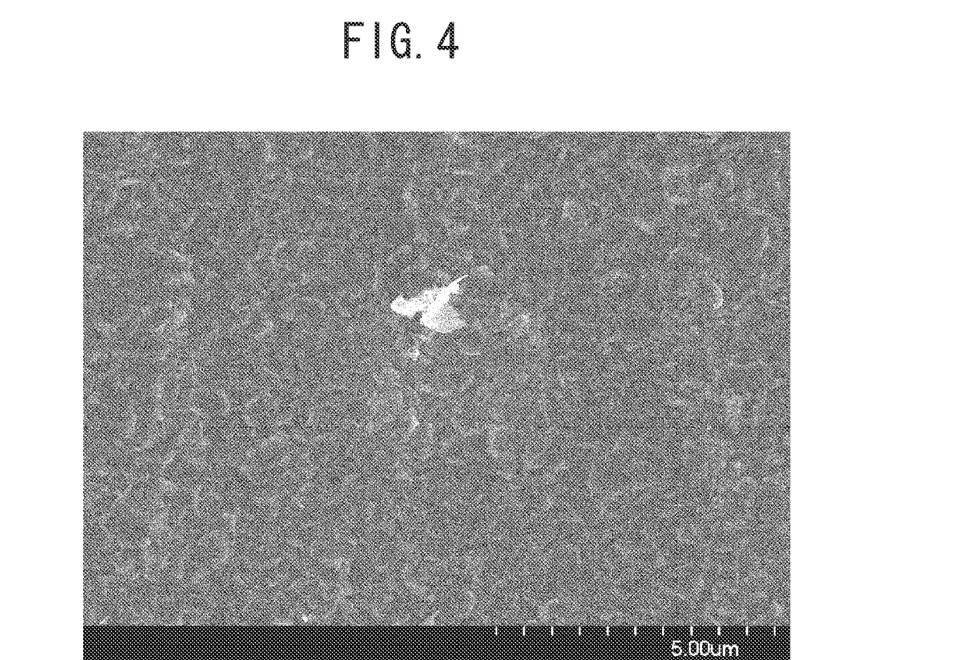
FIG. 4 is a SEM image in which the second principal plane processed in Example 1 is observed.

FIG. 3 and FIG. 4 illustrate SEM (Scanning Electron Microscope) images on the second principal plane of the aluminum nitride substrate of the semiconductor light-emitting element, after the semiconductor light-emitting element is subject to the process for 500 hours and then taken out from the chamber. FIG. 3 and FIG. 4 exhibit that the film having an uneven structure is formed on the second principal plane.

Figure 5:
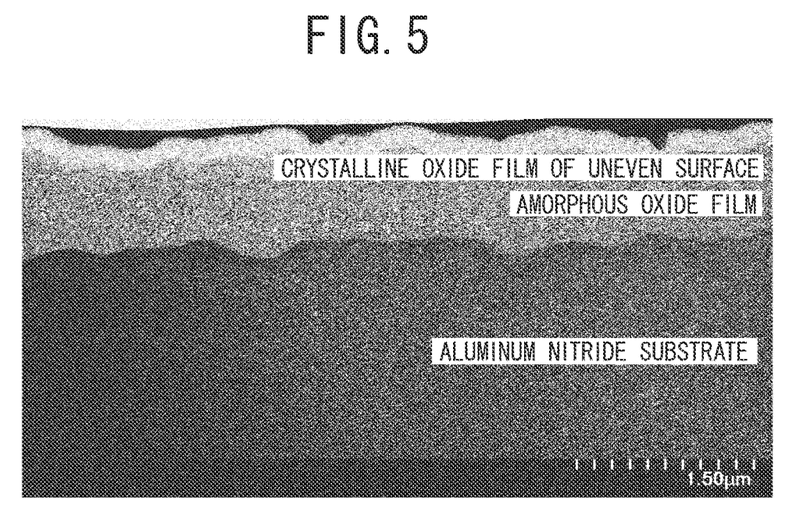
FIG. 5 is a STEM image in which the second principal plane processed in Example 1 is observed.

FIG. 5 illustrates a cross-sectional STEM image (20000 times) of the aluminum nitride substrate. From FIG. 5, it is understood that a first layer having a thickness of 550 nm on the second principal plane of the aluminum nitride substrate, and a second layer having a thickness of 300 nm and an uneven surface are formed. When the height of the uneven structure was measured from the cross-sectional STEM images (40000 times) of five places, the height of the uneven structure on the surface of the second layer was 160 nm and the height of the uneven structure at the interface between the first layer and the second principal plane of the aluminum nitride substrate was 140 nm. In addition, the height of the uneven structure at the interface between the first layer and the second layer was less than 10 nm, and it was flat. When the compositions and properties of the respective layers were analyzed by EDX (Energy Dispersive X-ray spectrometry) and electron beam diffraction, it was understood that the first layer was an amorphous oxide film with Al:O=1:3, and the second layer was a crystalline oxide film with Al:O=1:3.

Figure 6:
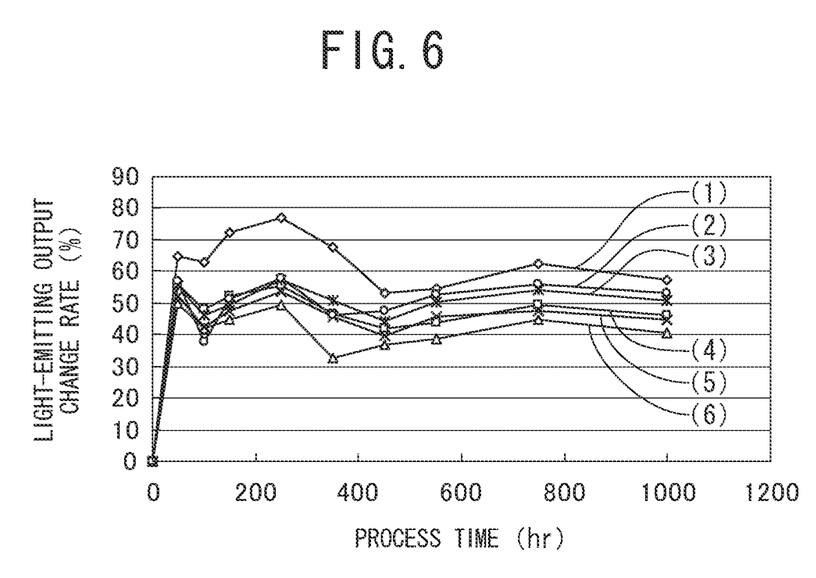
FIG. 6 is a graph illustrative of outputs that change over time of the semiconductor light-emitting element subject to oxidization and crystal growth in Example 1.

In addition, FIG. 6 illustrates a graph of outputs changing over time with respect to the process time with initial values being 0 hours. The horizontal axis of FIG. 6 indicates the process time (hr), whereas the vertical axis indicates the change rate (%) in the optical output. (1) to (6) in FIG. 6 are respective data of the six semiconductor light-emitting elements, as described above. It is understood that the outputs after the process (50 hours to 1000 hours) are increased by 30 to 80% from the initial values before the process (0 hours). That is to say, it is understood that in a state where there are water molecules on the second principal plane of the aluminum nitride substrate, the light extraction efficiency is remarkably improved by processing the semiconductor light-emitting elements in the chamber.

Example 2

Except that the second principal plane of the semiconductor light-emitting element was ground and then CMP was further carried out, the semiconductor light-emitting element obtained by a method similar to Example 1 was held for 50 hours under conditions that the temperature was 121° C., the relative humidity was 100%, and the relative pressure was 0.1 MPa.

Figure 7:
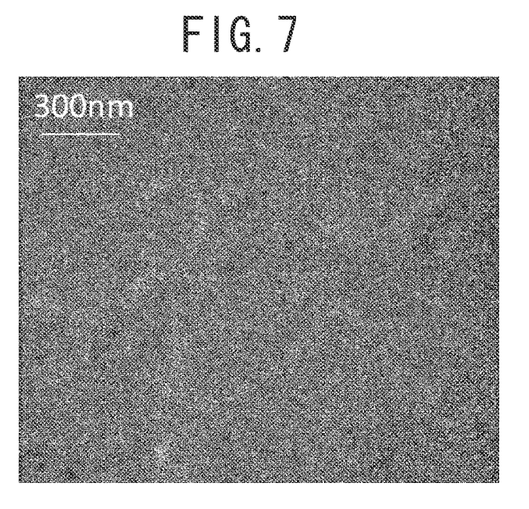
FIG. 7 is a SEM image in which the second principal plane processed in Example 2 is observed.

FIG. 7 illustrates a SEM image of the second principal plane of the aluminum nitride substrate of the semiconductor light-emitting element after the process. From FIG. 7, it is understood that an oxide film having a surface of an uneven structure is formed in a similar manner to Example 1.

Figure 8:
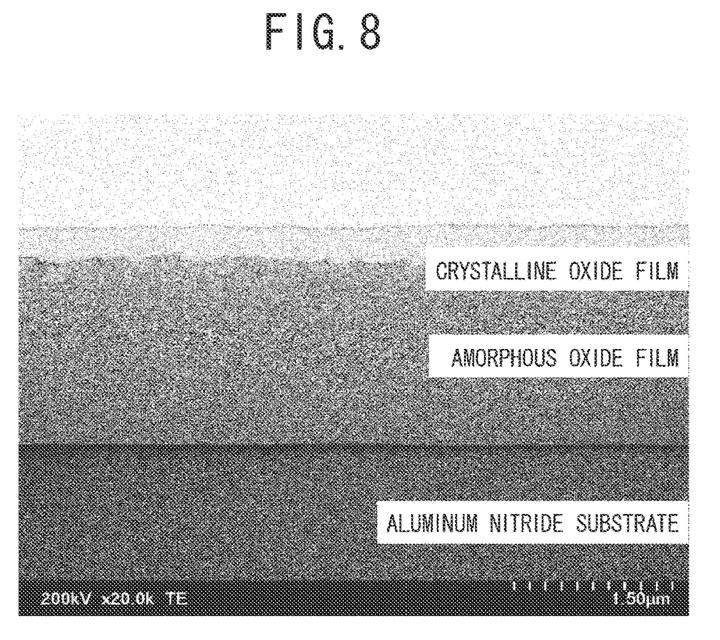
FIG. 8 is a STEM image in which the second principal plane processed in Example 2 is observed.

FIG. 8 illustrates a cross-sectional STEM image (20000 times) of the aluminum nitride substrate. From FIG. 8, it is understood that an amorphous oxide film (the first layer) having a thickness of 1400 nm on the second principal plane of the aluminum nitride substrate, and a crystalline oxide film (the second layer) having a thickness of 250 nm of an uneven surface are formed. The heights of the uneven structures were measured from the cross-sectional STEM images (40000 times) of five places. The height of the uneven structure on the surface of the second layer was 100 nm, and the heights of the uneven structures at the interface between the first layer and the aluminum nitride substrate and at the interface between the second layer and the first layer were less than 10 nm, and it was flat.

In addition, when the light-emitting intensities were compared before and after the process, the light-emitting intensity was improved by 10% after the process. When Example 2 is compared with Example 1, it is understood that the interface between the aluminum nitride substrate and the first layer having an uneven structure like Example 1 is suitable from a viewpoint of improving the light-emitting efficiency, in one embodiment. In addition, in order to form the uneven structure at the interface between the aluminum nitride substrate and the first layer like Example 1, it is understood that the state of the second principal plane of the aluminum nitride substrate before the inside of the chamber is subject to a heating process with the water molecules being introduced in the chamber would affect forming of the uneven structure. To be specific, it is understood that the uneven structure tends to be easily formed at the interface between the aluminum nitride substrate and the first layer after the second principal plane is ground.

Example 3

Except that the second principal plane of the semiconductor light-emitting element was ground and then CMP was further carried out, the semiconductor light-emitting element obtained by a method similar to Example 1 was held for 50 hours under conditions that the temperature was 121° C., the relative humidity was 65%, and the relative pressure was 0.03 MPa.

Figure 9:
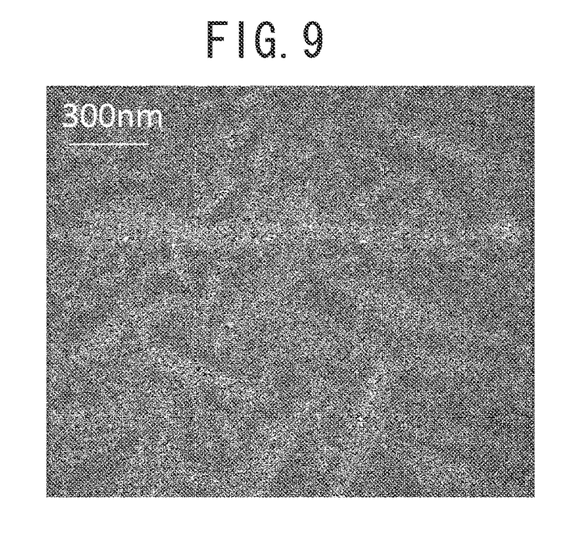
FIG. 9 is a SEM image in which the second principal plane processed in Example 3 is observed.

FIG. 9 illustrates a SEM image of the second principal plane of the aluminum nitride substrate of the semiconductor light-emitting element after the process. From FIG. 9, it is understood that an oxide film having a surface of an uneven structure is formed in Example 3 in a similar manner to Example 1.

When the light-emitting intensities were compared before and after the process, the light-emitting intensity was improved by 15% after the process. Accordingly, it is understood that the relative humidity of 65% or more is necessary for forming the oxide film capable of improving the light extraction efficiency.

Example 4

Except that the second principal plane of the semiconductor light-emitting element was ground and then CMP was further carried out, the semiconductor light-emitting element obtained by a method similar to Example 1 was held for 50 hours under conditions that the temperature was 105° C., the relative humidity was 100%, and the relative pressure was 0.02 MPa.

Figure 10:
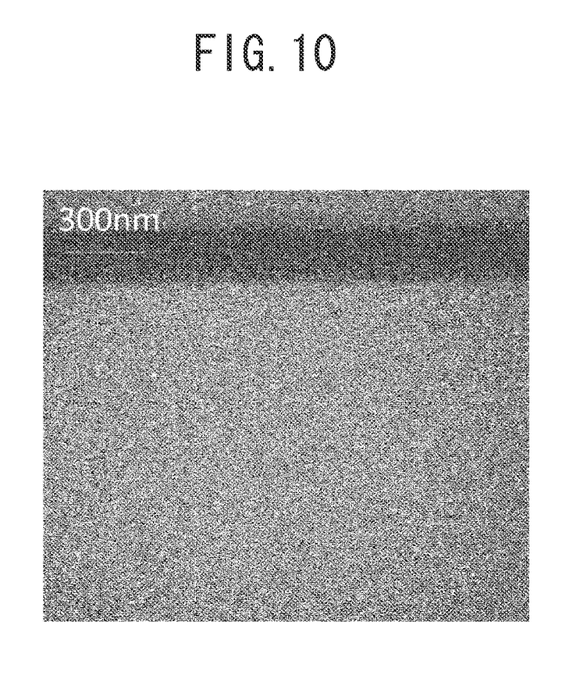
FIG. 10 is a SEM image in which the second principal plane processed in Example 4 is observed.

FIG. 10 illustrates a SEM image of the second principal plane of the aluminum nitride substrate of the semiconductor light-emitting element after the process. In Example 4, the surface state of the second principal plane before the process was same as those in Examples 2 and 3, whereas the surface state after the process was largely different from those in Examples 2 and 3 and was flat similar to the second principal plane before the process. Accordingly, it is supposed that the surface shape largely depends on the temperature.

Figure 11:
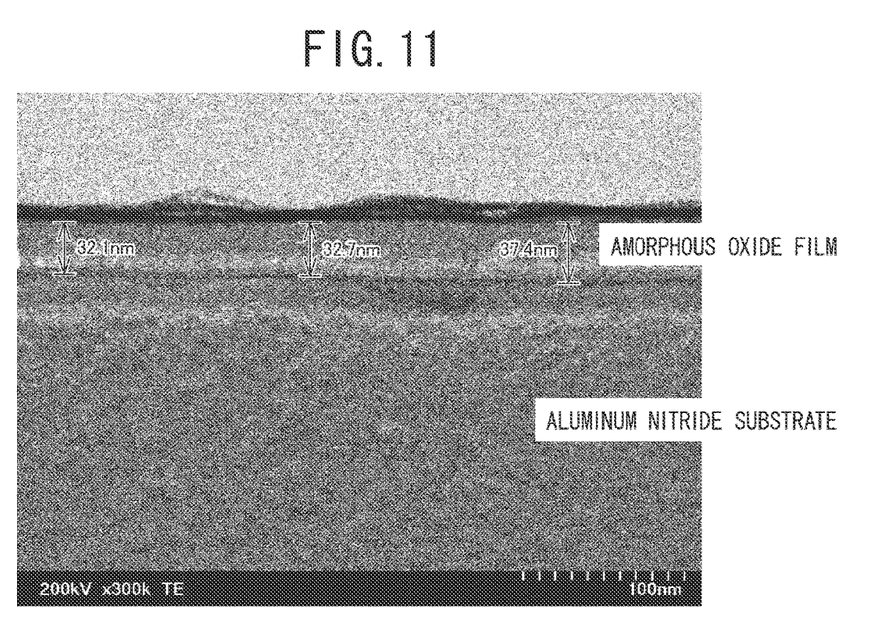
FIG. 11 is a STEM image in which the second principal plane processed in Example 4 is observed.

FIG. 11 illustrates a cross-sectional STEM image (500000 times) of the aluminum nitride substrate. From FIG. 11, it is understood that the first layer having a thickness of 32.7 nm is formed on the second principal plane of the aluminum nitride substrate. In addition, it is understood that the interface between the first layer and the aluminum nitride substrate has a flat structure.

Further, as for the sample of Example 4, the light-emitting intensity was improved by 15% by the above process. Accordingly, it is supposed that when the oxide film of at least 32.7 nm is formed, the light extraction efficiency improves.

Comparative Example 1

Except that the second principal plane of the semiconductor light-emitting element was ground and then CMP was further carried out, the semiconductor light-emitting element obtained by a method similar to Example 1 was held for 50 hours under conditions that the temperature was 25° C., the relative humidity was 100%, and the relative pressure was 0 MPa.

The oxide film of 10 nm or more was not formed by the above process, and the light-emitting intensity did not improve. That is, it is understood that unless the inside of the chamber is heated, any oxide film thick enough to be capable of improving the light extraction efficiency is not formed on the second principal plane of the aluminum nitride substrate.

Comparative Example 2

Except that the second principal plane of the semiconductor light-emitting element was ground and then CMP was further carried out, the semiconductor light-emitting element obtained by a method similar to Example 1 was held for 50 hours under conditions that the temperature was 121° C., the relative humidity was 0%, and the relative pressure was 0 MPa.

The oxide film of 10 nm or more was not formed by the above process, and the light-emitting intensity did not improve. That is to say, it is understood that in a state where the relative humidity is too low (the water molecules are not introduced substantially), any oxide film thick enough to be capable of improving the light extraction efficiency is not formed on the second principal plane of the aluminum nitride substrate.

Table 1 illustrates process conditions and the light-emitting intensity improvement rates of Examples and Comparative examples together.

TABLE 1

| | process conditions | | | light-emitting intensity |
|---|---|---|---|---|
| | second main plane | temperature [° C.] | relative humidity [%] time [hrs] | improvement rate [%] |
| example1 | grinding | 121 | 100 50~1000 | 30~80 |
| example2 | CMP | 121 | 100 50 | 10 |
| example3 | CMP | 121 | 65 50 | 15 |
| example4 | CMP | 105 | 100 50 | 15 |
| comparative example 1 | CMP | 25 | 100 50 | not improved |
| comparative example 2 | CMP | 121 | 0 50 | not improved |

Others

It is to be noted that the present invention is not limited to the above-described embodiments. It should be apparent that modifications and adaptations to those embodiments may occur based on knowledge of one skilled in the art and such modifications and adaptations should be included in the scope of the present invention.

In one embodiment of the present invention, there is provided a manufacturing method of a semiconductor light-emitting element, the manufacturing method including: setting in a chamber an aluminum nitride substrate in which a semiconductor layer is formed on a first principal plane; and heating an inside of the chamber with a water molecule being introduced in the chamber to form an oxide film including an amorphous oxide film and/or a crystalline oxide film on a second principal plane located on an opposite side to the first principal plane of the aluminum nitride substrate.

In addition, in the above-described manufacturing method of the semiconductor light-emitting element, in forming the oxide film, the oxide film having a surface of an uneven structure may be formed.

Further, in the above-described manufacturing method of the semiconductor light-emitting element, in forming the oxide film, relative humidity in the chamber may be equal to or higher than 50% and equal to or lower than 100%.

Furthermore, in the above-described manufacturing method of the semiconductor light-emitting element, in forming the oxide film, a temperature in the chamber may be equal to or higher than 100° C. and equal to or lower than 140° C.

Moreover, in the above-described manufacturing method of the semiconductor light-emitting element, in forming the oxide film, relative pressure in the chamber may be equal to or higher than 0.01 MPa and equal to or lower than 0.3 MPa.

In another embodiment of the present invention, there is provided a semiconductor light-emitting element, including: a semiconductor layer formed on a first principal plane of an aluminum nitride substrate; and an oxide film formed on a second principal plane located on an opposite side to the first principal plane of the aluminum nitride substrate, the oxide film being smaller in refractive index than the aluminum nitride substrate, wherein the oxide film includes an amorphous oxide film and/or a crystalline oxide film.

In addition, in the above-described semiconductor light-emitting element, an interface between the oxide film and the aluminum nitride substrate may have an uneven structure.

Further, in the above-described semiconductor light-emitting element, a surface of the oxide film may have an uneven structure.

Furthermore, in the above-described semiconductor light-emitting element, the oxide film may be a layered structure made of a plurality of the oxide films including the amorphous oxide film and the crystalline oxide film, and the oxide film may have an uneven structure at an interface between the amorphous oxide film and the crystalline oxide film.

In addition, in the above-described semiconductor light-emitting element, the oxide film may be a layered structure made of a plurality of the oxide films including the amorphous oxide film and the crystalline oxide film, and the oxide film may include the crystalline oxide film on the amorphous oxide film.

Further, in the above-described semiconductor light-emitting element, the oxide film may include Al.

Furthermore, in the above-described semiconductor light-emitting element, a thickness of the oxide film may be equal to or larger than 10 nm and equal to or smaller than 5 μm.

Moreover, in the above-described semiconductor light-emitting element, the oxide film may include at least the amorphous oxide film, and a thickness of the amorphous oxide film may be equal to or larger than 10 nm and equal to or smaller than 3 μm.

In addition, in the above-described semiconductor light-emitting element, the oxide film may include at least the crystalline oxide film, and a thickness of the crystalline oxide film may be equal to or larger than 10 nm and equal to or smaller than 2 μm.

Further, in the above-described semiconductor light-emitting element, the semiconductor layer may be a group III-V compound semiconductor layer including an element selected from the group consisting of at least aluminum, gallium, nitrogen, and indium.

Furthermore, in the above-described semiconductor light-emitting element, the second principal plane of the aluminum nitride substrate may be a C plane and an N plane in a hexagonal crystal.

In yet another embodiment of the present invention, there is provided, a semiconductor light-emitting element obtained by carrying out a method including: a setting process configured to set in a chamber an aluminum nitride substrate in which a semiconductor layer is formed on a first principal plane, and an oxide film forming process configured to heat an inside of the chamber with a water molecule being introduced in the chamber and to form an oxide film including an amorphous oxide film and/or a crystalline oxide film on a second principal plane located on an opposite side to the first principal plane of the aluminum nitride substrate.

Advantageous Effects

In one embodiment of the present invention, the inside of the chamber is heated with the water molecules being introduced in the chamber where the aluminum nitride film is arranged. Thus, it is possible to form an oxide film, including an amorphous oxide film and/or a crystalline oxide film and having a refractive index smaller than that of the aluminum nitride film, on the second principal plane of the aluminum nitride film. As a result, it is possible to remarkably improve the light extraction efficiency from the second principal plane of the aluminum nitride film.

In addition, in the process of forming the above-described oxide film (that is, oxide film forming process), no mask has to be formed with the use of a photolithography technique. Further, no dry etching process has to be carried out on the surface of the oxide film or the second principal plane of the aluminum nitride film. Accordingly, the mass productivity is good, and an etching damage onto the aluminum nitride film or the semiconductor layer can be suppressed.

Furthermore, in the oxide film forming process, after the semiconductor layer is formed, an oxide film is formed on the second principal plane. An uneven structure is formed on the second principal plane, instead that an optical pattern with the light extraction efficiency is arranged on a surface (at the interface between the substrate and the semiconductor layer) of the substrate on which the semiconductor layer is made to grow. Hence, a degradation in crystal property of the semiconductor layer can be suppressed without affecting a crystal defect occurrence at the time of the semiconductor layer growth in the oxide film forming process.

INDUSTRIAL APPLICABILITY

The present invention relates to a manufacturing method of a semiconductor light-emitting element, and the semiconductor light-emitting element, in particular, relates to an element with a high light-emitting efficiency in a nitride semiconductor light-emitting element formed on an aluminum nitride substrate.

REFERENCE SIGNS LIST 1 aluminum nitride substrate
1a first principal plane
1b second principal plane
10 semiconductor layer
11 n-type semiconductor layer
13 light-emitting layer
15 electron blocking layer
17 p-type semiconductor layer
20 oxide film
21 amorphous oxide film
23 crystalline oxide film
31 insulating film
33, 35 electrode portion
50 oxide film forming device
51 chamber
53 stage
55 nozzle
61 $H_2O$ supply source
81 heater
90 controller
100 semiconductor light-emitting element

What is claimed is:

1. A semiconductor light-emitting element, comprising: a semiconductor layer formed on a first principal plane of an aluminum nitride substrate; and an oxide film formed on a second principal plane located on an opposite side to the first principal plane of the aluminum nitride substrate, the oxide film being smaller in refractive index than the aluminum nitride substrate, wherein the oxide film is a layered structure made of a plurality of the oxide films including an amorphous oxide film and a crystalline oxide film, and wherein a thickness of the amorphous oxide film is equal to or larger than 10 nm and equal to or smaller than 3 µm, and a thickness of the crystalline oxide film is equal to or larger than 10 nm and equal to or smaller than 2 µm.

2. The semiconductor light-emitting element according to claim 1, wherein an interface between the oxide film and the aluminum nitride substrate has an uneven structure.

3. The semiconductor light-emitting element according to claim 1, wherein a surface of the oxide film has an uneven structure.

4. The semiconductor light-emitting element according to claim 1,
wherein the oxide film has an uneven structure at an interface between the amorphous oxide film and the crystalline oxide film.

5. The semiconductor light-emitting element according to claim 1,
wherein the oxide film includes the crystalline oxide film on the amorphous oxide film.

6. The semiconductor light-emitting element according to claim 1, wherein the oxide film includes Al.

7. The semiconductor light-emitting element according to claim 1, wherein the semiconductor layer is a group III-V compound semiconductor layer including an element selected from the group consisting of at least aluminum, gallium, nitrogen, and indium.

8. The semiconductor light-emitting element according to claim 1, wherein the second principal plane of the aluminum nitride substrate is a C plane and an N plane in a hexagonal crystal.

* * * * *